US005421071A

United States Patent [19]

Kanegae et al.

[11] Patent Number: 5,421,071

[45] Date of Patent: Jun. 6, 1995

[54] METHOD OF MAKING A PIEZOELECTRIC LIQUID-DROP EJECTION DEVICE

[75] Inventors: Takahiro Kanegae; Masahiko Suzuki, both of Nagoya; Hiroto Sugahara, Aichi; Yoshikazu Takahashi, Kasugai; Masayoshi Kinoshita; Manabu Yoshimura, both of Nagoya, all of Japan

[73] Assignee: Brother Kogyo Kabushiki Kaisha, Nogaya, Japan

[21] Appl. No.: 22,530

[22] Filed: Feb. 25, 1993

[30] Foreign Application Priority Data

Apr. 17, 1992 [JP] Japan .................................. 4-097928

[51] Int. Cl.[6] .............................................. H01L 41/22

[52] U.S. Cl. .................................. 29/25.35; 29/890.1

[58] Field of Search ............................ 29/25.35, 890.1; 346/140 R; 310/333

[56] References Cited

U.S. PATENT DOCUMENTS

| | | |
|---|---|---|
| 4,752,788 | 6/1988 | Yasuhara et al. . |
| 4,819,014 | 4/1989 | Yasuhara et al. . |
| 4,879,568 | 11/1989 | Bartky et al. . |
| 4,887,100 | 12/1989 | Michaelis et al. . |
| 4,929,256 | 5/1990 | Shepherd . |
| 4,940,996 | 7/1990 | Paton et al. . |
| 4,942,409 | 7/1990 | Paton et al. . |
| 4,973,981 | 11/1990 | Bartky et al. . |
| 4,992,808 | 2/1991 | Bartky et al. . |
| 5,003,679 | 4/1991 | Bartky et al. . |
| 5,016,028 | 5/1991 | Temple . |
| 5,028,936 | 7/1991 | Bartky et al. . |

FOREIGN PATENT DOCUMENTS

| | | |
|---|---|---|
| 0278590 | 8/1988 | European Pat. Off. . |
| 55-118874 | 9/1980 | Japan . |

*Primary Examiner*—Carl E. Hall

*Attorney, Agent, or Firm*—Oliff & Berrridge

[57] ABSTRACT

A liquid-drop ejection device having a plurality of ejectors each having a variable-capacity ink channel. The capacity of the ink channels is variable to generate sufficient pressure to thereby eject ink in the ink channels from nozzles communicating with the ink channels onto paper or the like. The ejection device further comprises a piezoelectric transducer having a plurality of walls for separating the ink channels from one another. The walls have drive electrodes formed on upper or lower portions. The upper portions of the walls are narrower in width than the lower portions. A method of forming the ejection device comprises a first step of forming grooves including portions for receiving drive electrodes, a second step of forming the drive electrodes in the grooves and a third step of further forming the grooves to provide additional portions having widths different from the portions of the grooves formed in the first step.

30 Claims, 5 Drawing Sheets

METHOD OF MAKING A PIEZOELECTRIC LIQUID-DROP EJECTION DEVICE

BACKGROUND OF THE INVENTION

1. Field of the Invention

The present invention relates to a liquid-drop ejection device for a drop-on-demand printer. More specifically, the present invention relates to a method for more effectively and accurately forming electrodes on the ejection device, and the ejection device produced by the method of the present invention.

2. Description of Related Art

A piezoelectric liquid-drop ejection device or ejector incorporated into a printer head to form a piezoelectric drop-on-demand ink jet printer has recently been proposed. The above ejection device is constructed such that the capacity of an ink chamber is varied depending on a variation in the orientation of a piezoelectric actuator, thereby ejecting ink from the ink chamber upon a reduction in the capacity of the ink chamber and drawing ink from an ink supply into the ink chamber upon an increase in the capacity of the ink chamber. Desired characters and images can be formed by providing a plurality of ejectors adjacent to one another and controllably ejecting ink from the plurality of ejectors.

This type of liquid-drop ejector has been disclosed in U.S. Pat. No. 5,028,936, 5,003,679 and 4,992,808, all to Bartley et al. for example. The conventional liquid-drop ejector will be described with reference to prior art FIGS. 7–9 of the present application. FIG. 8 shows a cross-sectional view of a portion of an array 1 of ejectors. A plurality of parallel ink channels 4 are spaced at given intervals from each other along the transverse direction of the ejector array 1. The channels 4 are defined by joining a piezoelectric ceramic plate 2 having a plurality of vertically extending side walls 3 to a cover 6. The side walls 3 are subjected to polarization processing in the direction indicated by the arrow D. Each of the ink channels 4 is shaped in the form of a long and narrow rectangular prism. Each of the side walls 3 extends along the entire length of each ink channel 4 and can be moved in a direction perpendicular to the long axis of each ink channel 4 to vary the pressure in the ink in each ink channel 4. Drive electrodes 5 apply driving electric fields to the side walls 3 and are formed only on the upper half (or alternately only on the lower half) of the side walls 3. The surfaces of the drive electrodes 5 are processed to be electrically insulated from the ink in the ink channels 4. Each ejector 7 of the ejector array 1 comprises an ink channel 4, a corresponding nozzle (not shown) which communicates with one end of the ink channel 4, an ink supply (not shown) which communicates with the other end of the ink channel 4, and the piezoelectrically deformable side walls 3 which define the ink channel 4.

Next, a drive circuit of the liquid-drop ejector is described below with reference to FIG. 9, which shows a cross-sectional view of the array 1. In the array 1, ink channels 4A through 4C are respectively formed by a cover 6, a piezoelectric ceramic plate 2 and side walls 3A through 3D of the piezoelectric ceramic plate 2. Drive electrodes 5A through 5H are formed on the corresponding upper half of the side walls 3A through 3D. The drive electrodes 5A through 5H are electrically connected to a CPU 11. The CPU 11 selects any one or more of the ejectors 7A through 7C to be driven in accordance with printing data, and controls the drive electrodes 5A–5H to drive the ejection devices 7A through 7C.

When the CPU 11 selects the ejection device 7B in response to predetermined printing data, for example, it applies driving electric fields between the drive electrodes 5C and 5D and between the drive electrodes 5E and 5F. At this time, the direction of application of the driving electric fields 10 meets at a right angle to the direction D of polarization. Therefore, the drive electrodes 5C, 5D, 5E and 5F cause the upper (or lower) half of the side walls 3B and 3C to deform under a piezoelectric thickness sliding effect. Accordingly, the side walls 3B and 3C are deformed to form doglegs angled away from the ink channel 4B, thereby increasing the capacity of the ink channel 4B. Accordingly, additional ink is drawn into the ink chamber 4B from the ink supply. When the CPU 11 is deactivated to remove the driving electric fields 10 from the adjacent drive electrodes 5C–5F, the side walls 3B and 3C return to their original positions. The pressure in the ink within the ink chamber 4B increases as the piezoelectric deformation of the side walls 3B and 3C first increases then decreases the capacity of the ink chamber 4B. As the ink chamber 4B is now overfilled with ink, droplets of ink are ejected from the nozzles connected to ink chamber 4B.

FIG. 7 shows a method for forming the conventional drive electrodes 5 employed in the liquid-drop ejectors. This conventional liquid-drop ejector forming method is described below. A piezoelectric ceramic plate 2 (or the like) is formed of a lead zirconate titanate (PZT) ceramic having a strong dielectric characteristic and is subjected to polarization processing along the direction indicated by the arrow D. The plate 2 is first provided with ink channels 4 by cutting a plurality of parallel grooves with a rotating diamond cutting disc or the like. Then, the drive electrodes 5 are formed on the side surfaces of the side walls 3 by a vapor deposition process. At this time, the piezoelectric ceramic plate 2 is inclined with respect to a target or a vapor deposition source. As a result, the drive electrodes 5 can be formed on the desired regions of the surfaces of the side walls 3 through the aperture or opening of the ink channels 4 formed between adjacent side walls 3, due to the shadow effects of the adjacent side walls 3. The electrode portions 51 formed on the end surfaces of the side walls 3 are removed by lapping or the like.

In the conventional liquid-drop ejector forming method, however, the drive electrodes are formed on only one side of each side wall 3 at a time. It is therefore necessary to execute two vapor deposition steps in order to form the drive electrodes 5 on both sides of each side wall 3. Strictly speaking, it is also difficult to form the drive electrodes 5 only on the desired portions (i.e., the upper or lower half) of the side walls.

SUMMARY OF THE INVENTION

With the foregoing problems in view, it is therefore an object of the present invention to provide a liquid-drop ejection device which accurately enables drive electrodes to be formed on only the desired portions of the side walls in a single step.

In order to achieve the above object, the present invention provides a liquid-drop ejection device having a plurality of ejectors and able to vary the capacity of each ink channel with a piezoelectric transducer, to thereby eject ink within the ink channels from nozzles which communicate with the ink channels, and a method of forming the liquid-drop ejection device. The liquid-drop ejection device is provided with a piezoelectric transducer having a plurality of walls separating the ink channels from one another. The walls have drive electrodes formed on either upper portions or lower portions of the walls and the upper portions of the walls are narrower in width in the transverse direction than the lower portions of the walls. According to the method of the present invention, the liquid-drop ejection device is formed by first defining a plurality of grooves as ink channels in a piezoelectric ceramic plate, the grooves having first predetermined widths, then forming drive electrode layers onto the piezoelectric ceramic plate, and finally re-processing the grooves with second predetermined widths different from the first predetermined widths of the plurality of grooves formed in the first step.

In the liquid-drop ejection device constructed according to the above-outlined method of the present invention, the plurality of walls separating the ink channels from one another include the drive electrodes formed on either the upper portions or the lower portions of the walls. The upper portions of the walls are narrower in width than the lower portions. In order to form the liquid-drop ejection device, the grooves, for the portions on which the drive electrodes are to be formed, are defined in the piezoelectric ceramic plate in the first step. Then, the drive electrodes are formed in the corresponding grooves in the second step. Thereafter, in the third step, the grooves for the portions unnecessary to form the drive electrodes are processed in the widths different from those of the grooves which have been processed in the first step.

BRIEF DESCRIPTION OF THE DRAWINGS

The invention will be described with reference to the following drawings, wherein.

DETAILED DESCRIPTION OF THE PREFERRED EMBODIMENTS

Figure 1:
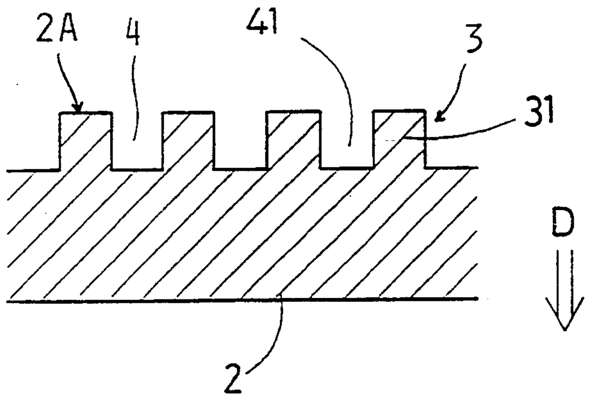
FIG. 1 is a cross-sectional view showing a first step for executing a method of forming a liquid-drop ejection device of a first preferred embodiment according to the present invention.

A first preferred embodiment of the present invention, will hereinafter be described in detail with reference to FIGS. 1 through 4. The same elements of structure of the ejection devices of the present invention as those employed in the conventional ejector are identified by like reference numerals for convenience.

FIG. 1 shows a first step in which a plurality of grooves are defined in a piezoelectric ceramic plate 2. The piezoelectric ceramic plate 2 is formed of a lead zirconate titanate (PZT) ceramic or the like having a strong dielectric characteristic. The ceramic plate 2 has been subjected to polarization processing along the direction indicated by the arrow D and has a thickness of about 1 mm or so. A plurality of parallel grooves 4 are cut into a first surface 2A of the piezoelectric ceramic plate 2 by rotating a diamond cutting disc or the like to form a plurality of first ink channel portions 41 and a plurality of first sidewall portions 31 of sidewalls 3.

Figure 2:
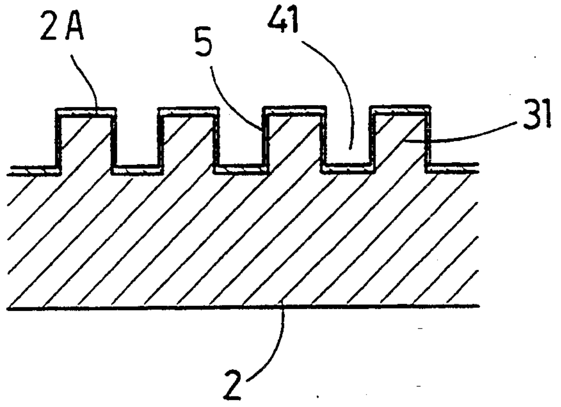
FIG. 2 is a cross-sectional view showing a second step for executing the method of forming the liquid-drop ejection device of FIG. 1.

FIG. 2 shows the second step of the first preferred embodiment, in which a drive electrode 5 is completely formed over the entire first surface 2A by vapor deposition using metallic materials such as aluminum, nickel or the like. The drive electrode 5 formed in the apertures of the ink channels 41 including the surfaces of the first side wall portions 31 of the first ink channel portions 41.

Figure 3:
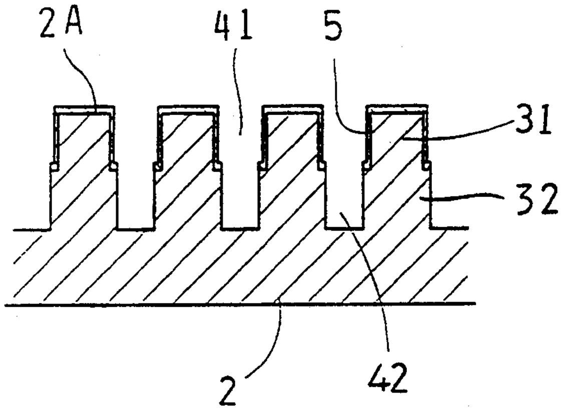
FIG. 3 is a cross-sectional view showing a third step for executing the method of forming the liquid-drop ejection device of FIG. 1.
Figure 4:
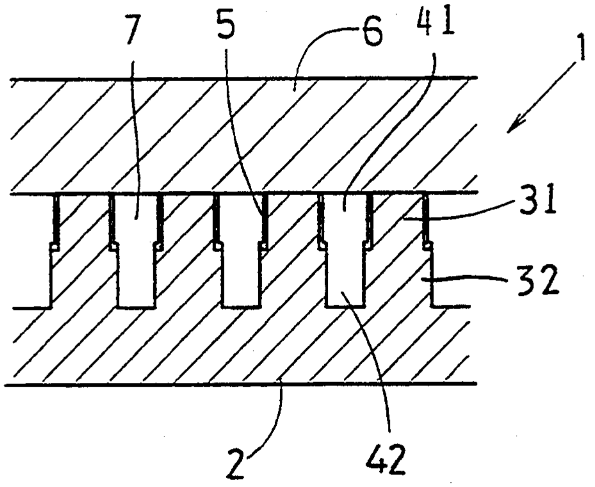
FIG. 4 is a view showing an array of the liquid-drop ejection device of FIG. 1.
Figure 9:
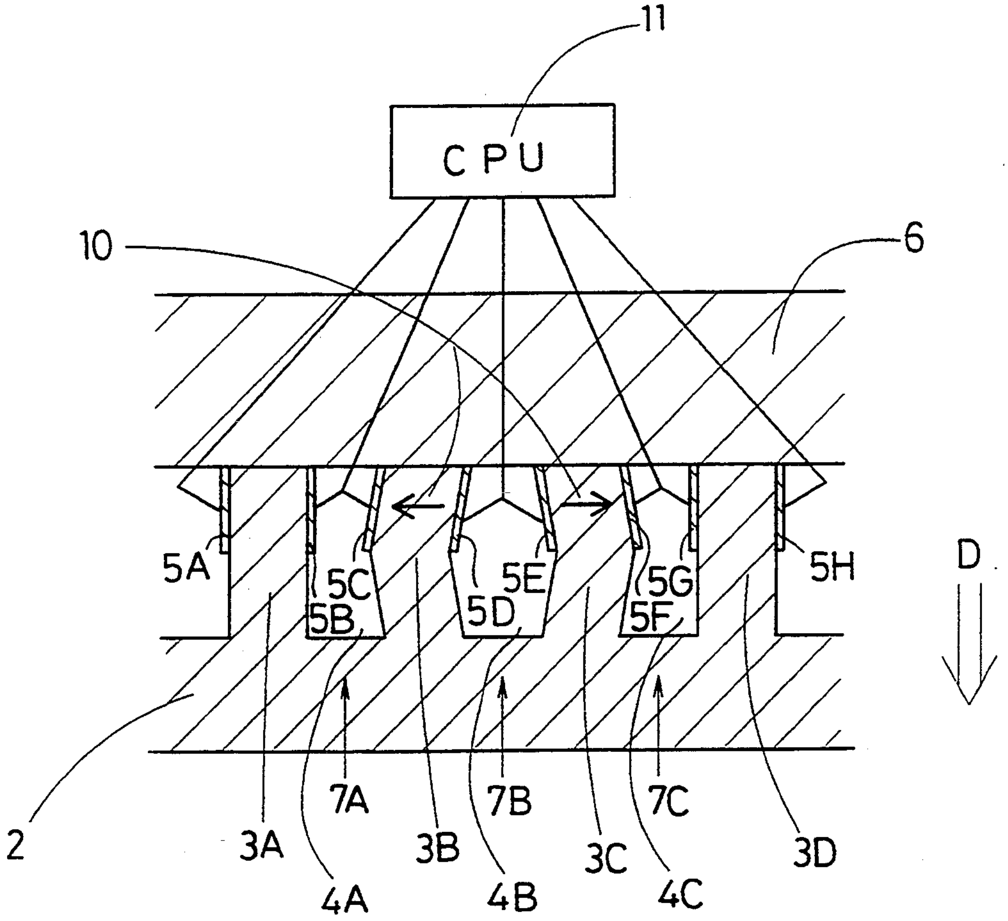
Fig.9 RELATED ART
FIG. 9 is a view showing a drive circuit employed in the conventional liquid-drop ejection device.

FIG. 3 illustrates the third step of the first preferred embodiment, in which the grooves 4 are recut into the piezoelectric ceramic plate 2. FIG. 4 depicts an array from which the unnecessary electrode portion disposed on the upper surfaces of the side walls 31 have been removed by lapping or the like and a cover 6 attached to the ceramic plate 2. Referring to FIG. 3, each of the grooves 4 is re-processed based on the same pitch (i.e., center-center interval) as that of each groove 4 defined in the first step, but at a width smaller than that of each first groove. The depth of each second groove portion 42 is the same depth as that of each first groove portion 41 formed in the first step. Thus, each of the side walls 3 formed in the first and third steps of the first preferred embodiment has an upper half 31 which is narrower in width than a lower half 32, and is formed with a drive electrode 5 only in the upper half portion 31. As shown in FIG. 4, an array 1 of the liquid-drop ejectors 7 of the ejection device of the first preferred embodiment is formed by removing the unnecessary electrodes provided on the first surface 2A of the ceramic plate 2 by the lapping or the like and by joining a cover 6 formed of a material having a linear expansion coefficient substantially identical to that of the piezoelectric ceramic plate 2. Preferably, cover 6 is formed of the same material as the side walls 3. The ejector device 1 is completed by joining an orifice plate (not shown) having nozzles corresponding to the ink channels 4 to a location in front of the ink channels 4. Accordingly, the array 1 of ejectors 7 thus formed correspond to the array of ejectors 7A–7C as shown in FIG. 9.

Figure 5:
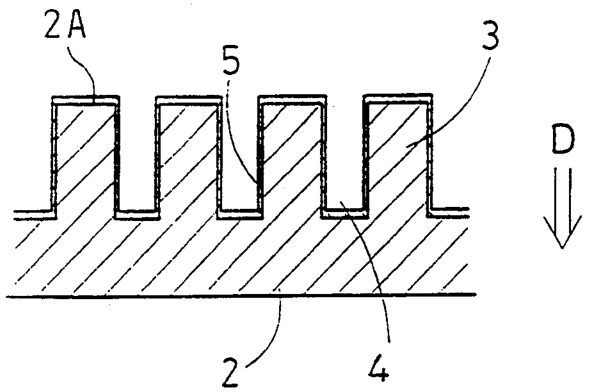
FIG. 5 is a cross-sectional view showing a second preferred embodiment of the method for forming the liquid-drop ejection device.
Figure 6:
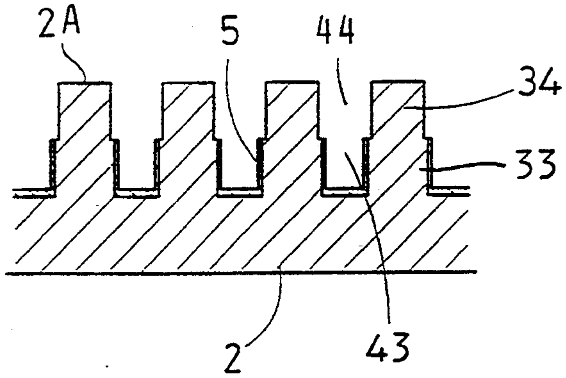
FIG. 6 is a cross-sectional view showing the third step of the second preferred embodiment the method of forming the liquid-drop ejection device.
Figure 7:
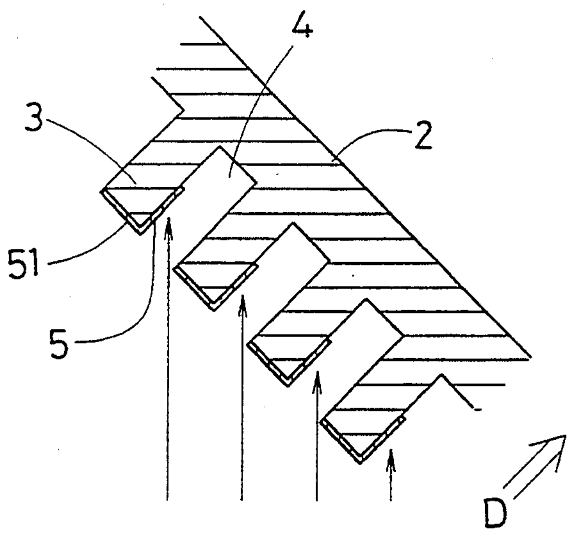
Fig.7 RELATED ART
FIG. 7 is a view showing a method of forming drive electrodes employed in a conventional liquid-drop ejection device.
Figure 8:
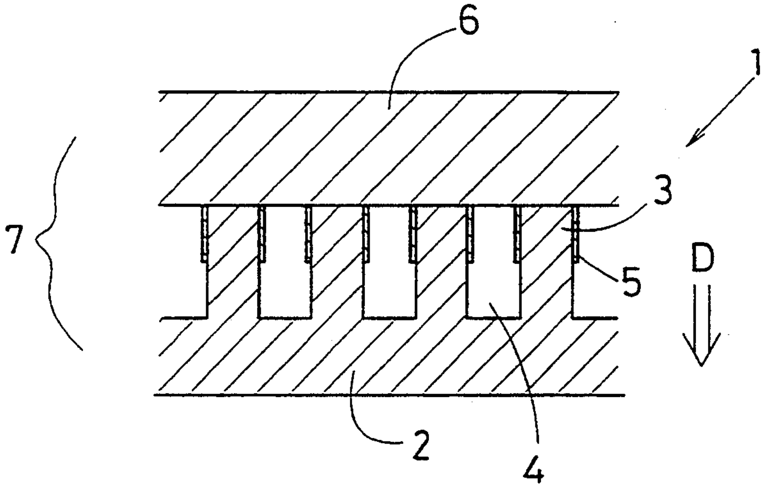
Fig.8 RELATED ART
FIG. 8 is a view showing an array of the conventional liquid-drop ejection device.

FIGS. 5 and 6 respectively show the second and third steps of the second preferred embodiment of the present invention. In FIG. 5, the first step of cutting the grooves has already been performed to define a plurality of grooves in the piezoelectric ceramic plate 2 to form the side walls 3 and the ink channels 4. In the second step of the second preferred embodiment, the drive electrode 5 is formed in the openings or apertures of the grooves 4 on the side walls 3. In the third step shown in FIG. 6, each of the grooves 4 is re-processed at the same pitch as that of the first step and in a width wider than that of the first step to form an upper portion 44. Accordingly, each of the grooves 4 now comprises the upper portion 44 and a lower portion 43 and each side wall 3 comprises an upper portion 34 and a lower portion 33, as shown in FIG. 5. The upper and lower portions 44 and 43 are each half of the depth of each original groove 4. The upper portion 43 is devoid of the unnecessary electrodes 5 which had been formed on the upper half of the side walls 3. The upper portions 34 of the sidewalls 3 are narrower than the lower portions 33. Additionally, the electrodes 5 formed on the first surface 2a of the ceramic plate 2 are eliminated by lapping or the like. The upper portion 34 of each of the side walls is narrower in width than a lower portion 33 of the side walls 3. Accordingly, the drive electrodes 5 are formed only at the desired lower portion 33 of each side wall 3.

In the first and second embodiments, the width of each side wall 3 varies between the upper portions 31 and 34 and the lower portions 32 and 33, respectively, and each drive electrode 5 is formed on one of the upper and lower portions of the surface of each side wall 3. However, the present invention is not necessarily limited to the above described sidewall regions and these regions on which the electrodes 5 are formed may be varied as required.

As has been apparent from the above description, a liquid-drop ejection device of the present invention includes a piezoelectric transducer having a plurality of walls 3 forming separating ink channels 4 from one another. The walls 3 have drive electrodes 5 formed on either upper portions 31 or lower portions 33. The upper portions 31 and 34 of the walls 3 are narrower in width than the lower portions 32 and 33. The liquid-drop ejection device is formed in accordance with a first step of defining grooves for the ink channels in a piezoelectric ceramic plate 2 at predetermined intervals, a second step of forming drive electrode layers 5 on the piezoelectric ceramic plate 2, and a third step of reprocessing each of the grooves 4 in a width different from that of each ink channel 4 formed in the first step. Therefore, the drive electrodes 5 can be accurately formed on only desired portions of side walls in a single simple process.

What is claimed is:

1. A method for forming an ejection device for a drop-on-demand printer, comprising the steps of:
 forming a piezoelectric ceramic plate having a first surface;
 forming a plurality of ink channels in the first surface of the ceramic plate, each of the ink channels comprising a first ink channel portion having a first depth and a first width and separated from adjacent ink channels by a plurality of side walls;
 forming a drive electrode layer on the first surface, including the plurality of ink channels and side walls; and
 reforming the plurality of ink channels to provide each ink channel with a second ink channel portion, the second ink channel portion having a second width different from the first width of the first channel portion.

2. The method of claim 1, further comprising the steps of removing the electrode layer from the first surface of the ceramic plate; and
 attaching a cover to the first surface of the ceramic plate.

3. The method of claim 1, wherein the first channel width is greater than the second channel width.

4. The method of claim 3, wherein the electrode layer is provided only on the first ink channel portion.

5. The method of claim 1, wherein the first channel width is less than the second channel width.

6. The method of claim 5, wherein the electrode layer is removed from the second ink channel portion during the reforming step.

7. The method of claim 1, wherein the first channel depth is substantially twice the second channel depth.

8. The method of claim 1, wherein the first channel depth, from a transition point between the first and second ink channel portions to one of the first surface and a bottom surface of the ink channel, is substantially the same as the second channel depth, from the transition point to another of the first and bottom surfaces.

9. The method of claim 1, wherein the electrode layer is provided on the first channel portion.

10. A method for forming an ejector device for a drop-on-demand printer, comprising the steps of:
 forming a piezoelectric ceramic plate having a first surface;
 forming a plurality of parallel ink channels in the first surface of the ceramic plate, each of the ink channels separated from adjacent ink channels by an upright side wall each ink channel having a first channel depth from the first surface and a first channel width, and each side wall having a first sidewall height and a first sidewall width;
 forming an electrode layer on the first surface of the ceramic plate, including the plurality of ink channels and each side wall; and
 reforming each ink channel to provide each ink channel with a first portion having the first channel width and the first channel depth, and a second portion having a second channel width different from the first channel width, wherein the electrode layer is provided on at most one of the first and second portions of each ink channel.

11. The method of claim 10, wherein the electrode layer is provided on the first channel portion.

12. The method of claim 10, wherein the first channel width is greater than the second channel width.

13. The method of claim 10, wherein the first channel width is less than the second channel width.

14. The method of claim 10, wherein the first channel depth is substantially twice the second channel depth.

15. The method of claim 10, wherein the first channel depth, from a transition point between the first and second ink channel portions to one of the first surface and a bottom surface of the ink channel, is substantially the same as the second channel depth, from the transition point to another of the first and bottom surfaces.

16. A method for forming an ejection device for a drop-on-demand printer, comprising the steps of:
 forming a piezoelectric ceramic plate having a first surface;
 forming a plurality of ink channels in the first surface of the ceramic plate, each of the ink channels comprising a first ink channel portion having a first depth from the first surface and a first width and separated from adjacent ink channels by a plurality of side walls;
 forming a drive electrode layer on the first surface, including the plurality of ink channels and side walls; and
 reforming the plurality of ink channels to provide each ink channel with a second ink channel portion, the second ink channel portion having a second width different from the first width of the first channel portion and a second depth from the first surface different from the first depth of the first channel portion.

17. The method of claim 16, further comprising the steps of:

removing the electrode layer from the first surface of the ceramic plate; and attaching a cover to the first surface of the ceramic plate.

18. The method of claim 16, wherein the electrode layer is provided on the first channel portion.

19. The method of claim 16, wherein the first channel width is greater than the second channel width.

20. The method of claim 19, wherein the electrode layer is provided only on the first ink channel portion.

21. The method of claim 16, wherein the first channel width is less than the second channel width.

22. The method of claim 21, wherein the electrode layer is removed from the second ink channel portion during the reforming step.

23. The method of claim 16, wherein the first channel depth is substantially twice the second channel depth.

24. The method of claim 16, wherein the first channel is substantially one-half the second channel depth.

25. A method for forming an ejector device for a drop-on-demand printer, comprising the steps of:

forming a piezoelectric ceramic plate having a first surface;

forming a plurality of parallel ink channels in the first surface of the ceramic plate, each of the ink channels separated from adjacent ink channels by an upright side wall each ink channel having a first channel depth from the first surface and a first channel width, and each side wall having a first sidewall height and a first sidewall width;

forming an electrode layer on the first surface of the ceramic plate, including the plurality of ink channels and each side wall; and reforming each ink channel to provide each ink channel with a first portion having the first channel width and the first channel depth, and a second portion having a second channel width different from the first channel width, and a second channel depth from the first surface different from the first depth, wherein the electrode layer is provided on at most one of the first and second portions of each ink channel.

26. The method of claim 25, wherein the electrode layer is provided on the first channel portion.

27. The method of claim 25, wherein the first channel width is greater than the second channel width.

28. The method of claim 25, wherein the first channel width is less than the second channel width.

29. The method of claim 25, wherein the first channel depth is substantially twice the second channel depth.

30. The method of claim 25, wherein the first channel depth is substantially one-half the second channel depth.

* * * * *